(12) United States Patent
Sornin et al.

(10) Patent No.: US 8,169,352 B2
(45) Date of Patent: May 1, 2012

(54) JITTER INSENSITIVE SIGMA-DELTA MODULATOR

(75) Inventors: Nicolas Sornin, La Tronche (FR); Davide Orifamma, Valbonne (FR)

(73) Assignee: Cambridge Silicon Radio Limited, Cambridge (GB)

( * ) Notice: Subject to any disclaimer, the term of this patent is extended or adjusted under 35 U.S.C. 154(b) by 79 days.

(21) Appl. No.: 12/676,866

(22) PCT Filed: Aug. 7, 2008

(86) PCT No.: PCT/EP2008/060422
§ 371 (c)(1),
(2), (4) Date: May 26, 2010

(87) PCT Pub. No.: WO2009/030580

PCT Pub. Date: Mar. 12, 2009

(65) Prior Publication Data
US 2010/0295715 A1        Nov. 25, 2010

(30) Foreign Application Priority Data

Sep. 6, 2007   (GB) .................................. 0717342.0

(51) Int. Cl.
*H03M 3/00*   (2006.01)
(52) U.S. Cl. ...................................... 341/143
(58) Field of Classification Search .................. 341/143
See application file for complete search history.

(56) References Cited

U.S. PATENT DOCUMENTS

| | | | |
|---|---|---|---|
| 6,111,531 A * | 8/2000 | Farag | 341/143 |
| 7,142,143 B2 * | 11/2006 | Draxelmayr | 341/143 |
| 7,375,666 B2 * | 5/2008 | Melanson | 341/143 |
| 2003/0080888 A1 | 5/2003 | Muhammad et al. | |
| 2005/0123072 A1 | 6/2005 | Guimaraes | |
| 2005/0206543 A1 | 9/2005 | Draxelmayr | |
| 2005/0275580 A1 | 12/2005 | Hong et al. | |
| 2005/0285763 A1 * | 12/2005 | Nguyen et al. | 341/120 |
| 2007/0171109 A1 | 7/2007 | Mitteregger | |
| 2008/0062026 A1 * | 3/2008 | Melanson | 341/155 |
| 2008/0272946 A1 * | 11/2008 | Melanson | 341/143 |

FOREIGN PATENT DOCUMENTS

EP    2179508    4/2010

OTHER PUBLICATIONS

International Search Report for PCT/EP2008/060422. Written Opinion of the International Searching Authority for PCT/EP2008/060422.
Search Report for GB0717342.0.
United Kingdom Patent Application No. GB0717342.0, Examination Report, Nov. 22, 2011.

* cited by examiner

*Primary Examiner* — Howard Williams
(74) *Attorney, Agent, or Firm* — Greenberg Traurig, LLP

(57) ABSTRACT

A sigma-delta modulator for forming a digital output signal representative of a voltage level of an input signal, the sigma delta modulator having a node arranged to receive a current flow that is representative of the voltage level of the input signal and on whose voltage the digital output signal is dependent, the sigma-delta modulator comprising a plurality of capacitive elements for smoothing the current flow, each capacitive element being connected at one end to the node and at its other end to a respective switch unit and a plurality of switch units, each switch unit being arranged to connect the respective one of the capacitive elements to either a first voltage level or a second voltage level in dependence on the voltage at the node so as to provide feedback that affects the voltage at the node.

25 Claims, 5 Drawing Sheets

JITTER INSENSITIVE SIGMA-DELTA MODULATOR

RELATED APPLICATIONS

This application is a U.S. National Phase Application based on PCT Application No. PCT/EP2008/060422, filed 7 Aug. 2008, (title: JITTER INSENSITIVE SIGMA-DELTA MODULATOR; applicant: Cambridge Silicon Radio Limited), which claims priority to United Kingdom Application No. GB 0717342.0, filed 6 Sep. 2007 (title: JITTER INSENSITIVE SIGMA-DELTA MODULATOR; applicant: Cambridge Silicon Radio Limited), and each of the foregoing applications is incorporated by reference herein in its entirety.

FIELD OF THE DISCLOSURE

The disclosure relates to a continuous time sigma-delta modulator.

BACKGROUND

Sigma-delta modulators are analog-to-digital converters arranged to receive an analog input signal and output a digital signal in which the relative density of 'ones' and 'zeros' is proportional to the voltage level of the analog input signal.

A simple sigma-delta modulator is shown in FIG. 1. The sigma-delta modulator receives an analog input signal 101 which is input into a summation unit 102. The summation unit sums the analog input signal with a feedback signal output by a digital-to-analog converter (DAC) 106 in the feedback path. The summed signal is then integrated by integrator 103 and passed to a quantizer 104 that compares the integrated signal with one or more threshold voltages and outputs a digital output signal 105 in dependence on that comparison. The digital-to-analog converter receives the digital output signal and converts it into an analog signal for summing with the analog input signal.

The purpose of the feedback signal is to maintain the average output of the integrator near the comparator's reference level by making the ones and zeros of the digital output signal representative of the analog input signal.

The input range of the sigma-delta modulator is set by the upper and lower voltage limits of the analog feedback signal. The relative proportions of 'ones' and 'zeros' in the digital output signal represent the voltage level of the analog input signal relative to the input range of the modulator. If, for example, the input range of the modulator is 0 to 5V and the voltage level of the input signal is 2.5V, the digital output signal should contain 50% 'ones' and 50% 'zeros'. If the input signal exceeds the input range of the modulator then the digital output signal does not correctly represent the voltage level of the input signal.

The quantizer is preferably arranged to sample the integrated signal at high frequency. A high sampling frequency provides noise performance benefits. Oversampling causes quantization noise to be spread over a wider frequency range but oversampling does not change the signal-to-noise ratio. Therefore, oversampling has the effect of decreasing noise magnitude over the frequency range of interest. The sigma-delta modulator may suitably be followed by a low-pass filter to remove the high frequency noise.

Oversampling alone does not account for the high resolution offered by sigma-delta modulators. The sampling frequency that would be required to achieve high resolution modulation is typically too high to be practically realizable. Instead, further noise performance benefits are provided by the integrator, which 'shapes' noise out of low frequencies and into higher frequencies. This further reduces the noise magnitude over the frequency range of interest. Once again, the noise 'shaped' into higher frequencies can be removed by filtering the digital output signal.

The sigma-delta modulator shown in FIG. 1 is a simple, first-order sigma-delta modulator. Further complexity can be introduced by having a multi-bit quantizer rather than a single bit quantizer and by having more than one integrator.

Sigma-delta modulators are commonly implemented as discrete-time systems in which voltage levels are propagated through the modulator at each clock period. However, continuous-time implementations also exist and typically offer power-saving advantages over discrete-time implementations, together with higher input bandwidths.

An example of a continuous-time sigma-delta modulator is shown in FIG. 2. The analog input signal 201 is combined with a feedback signal, which in this example is provided by current source 206, before being passed to an integrator 207. In this example the integrator comprises an operational amplifier 202 and a capacitor 203. The integrated signal is received by the quantizer 204 to form a digital output signal 205. The digital output signal is fed back via the feedback loop and input into the current source to generate a suitable feedback signal for combining with the analog input signal.

The current source in FIG. 2 effectively injects pulses of current into the summing junction at each clock transition. The aim is to maintain zero average current into the summing junction. However, the total charge injected into the summing injection during a clock pulse is dependent on the length of that pulse. Theoretically, the time between each clock transition should be of identical duration. However, in reality clock jitter means that the time between clock transitions can vary slightly with time. This causes noise that directly modulates the feedback signal and adds directly to the analog input signal. This additional noise can cause significant degradation in the performance of a sigma-delta modulator.

A further source of noise in a sigma-delta modulator is quantizer metastability. When the input signal to a quantizer is near a threshold level, the quantizer takes more time than usual to stabilise at one output level. This results in a feedback current that is not well defined, which is equivalent to injecting a large error into the summing junction. This phenomenon causes 'noise filling' in which high frequency quantization noise is 'folded' into the frequency band of interest. This problem limits the performance of the modulator and increases with modulator order.

Additional performance limitations result from the non-linearity and non-ideal transfer function of the integrator. Non-linearity of the integrator causes quantization noise to be 'folded' into the frequency band of interest. A non-ideal transfer function of the integrator at high frequencies modifies the noise shaping function of the modulator. It also introduces an extra delay into the loop. For high frequency and high bandwidth continuous time implementations this can be one of the main issues affecting the stability of the modulator.

Because of the performance limitations described above, many existing implementations of continuous-time sigma-delta modulators use switched capacitors and multi-bit quantizers. An example of such a sigma-delta modulator is shown in FIG. 3. This sigma-delta modulator includes a switched capacitor 306 for receiving the input signal 301. The modulator includes an integrator 302 and a current source 305 as before. The modulator also incorporates a multi-bit quantizer 303. The multi-bit quantizer causes jitter sensitivity to be reduced by $2^N$, where N is the number of bits output by the quantizer at any given time instant and received by the DAC in the feedback path.

Although incorporating a switched capacitor and/or a multi-bit quantizer into a sigma-delta modulator helps to address the problems caused by clock jitter, both the switched capacitor and the multi-bit quantizer introduce additional problems of their own. First, the switched capacitor limits the maximum signal bandwidth. Second, the switched capacitor introduces a delay into the modulator that effectively returns the modulator to a discrete time implementation. Finally, the operational amplifier of the integrator has to 'swallow' the charge introduced by the switched capacitor in one sampling period, which requires the operational amplifier to settle quickly. The gain-bandwidth product of the operational amplifier then needs to be equivalent to that of the switched capacitor, which cancels the power saving potential of a continuous-time implementation. Using a multi-bit quantizer can cause DAC non-linearity, which causes noise folding, and increased quantizer power consumption.

There is therefore a need for an improved sigma-delta modulator that addresses the problems outlined above.

BRIEF DESCRIPTION OF THE DRAWINGS

For a better understanding of the present disclosure, reference is made by way of example to the following drawings, in which.

DETAILED DESCRIPTION

Figure 1:
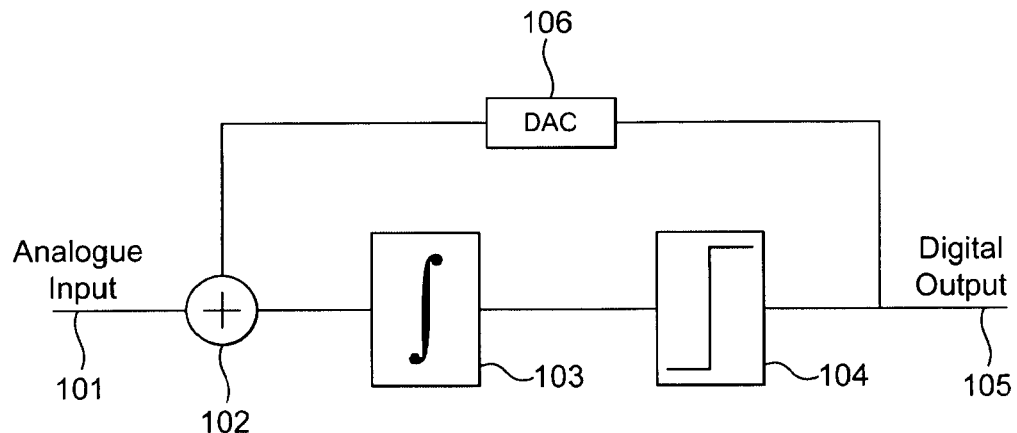
FIG. 1 shows a first order sigma-delta modulator.
Figure 2:
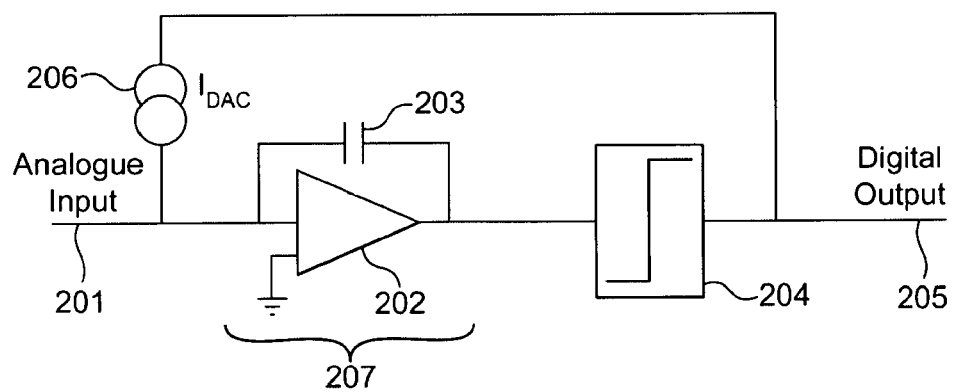
FIG. 2 shows a continuous-time sigma-delta modulator.
Figure 3:
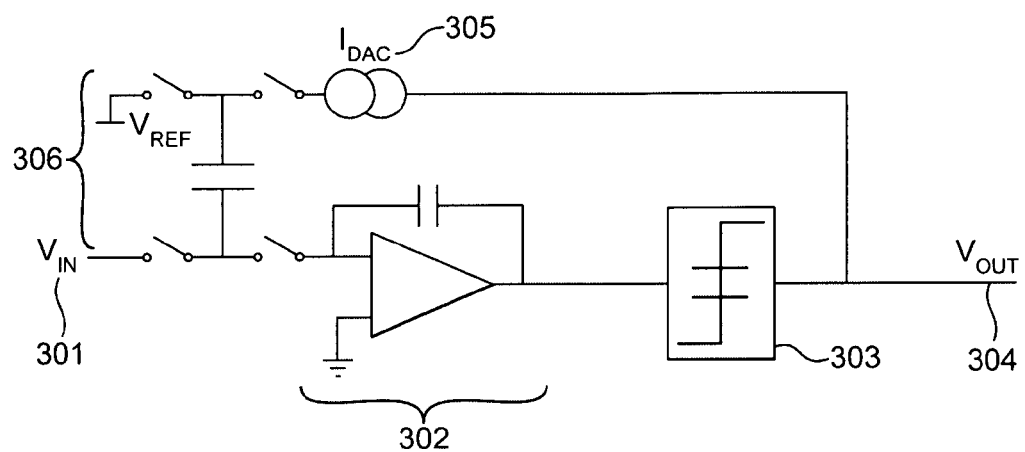
FIG. 3 shows a sigma-delta modulator including a switched-capacitor and multi-bit quantizer.

According to a first aspect of the disclosure, there is provided a sigma-delta modulator for forming a digital output signal representative of a voltage level of an input signal, the sigma delta modulator having a node arranged to receive a current flow that is representative of the voltage level of the input signal and on whose voltage the digital output signal is dependent, the sigma-delta modulator comprising a plurality of capacitive elements for smoothing the current flow, each capacitive element being connected at one end to the node and at its other end to a respective switch unit and a plurality of switch units, each switch unit being arranged to connect the respective one of the capacitive elements to either a first voltage level or a second voltage level in dependence on the voltage at the node so as to provide feedback that affects the voltage at the node.

The sigma-delta modulator may be arranged such that connecting a capacitive element to the second voltage level causes an electrical charge to be transferred to that capacitive element.

The sigma-delta modulator may be arranged such that the voltage level at the output node is changed dependent on an electrical charge transferred to a capacitive element.

The sigma-delta modulator may be arranged such that the change in voltage at the output node caused by connecting one or more of the capacitive elements to the second voltage level is equal to the second voltage level divided by the number of those one or more capacitive elements connected to the second voltage level.

The sigma-delta modulator may be arranged such that the voltage level at the node during a sampling interval is changed dependent on the flow of current representative of the input voltage through the capacitive element during that sampling interval.

The sigma-delta modulator may comprise a quantizer arranged to form the digital output signal by selecting a voltage level for the digital output signal at predetermined sampling intervals, the quantizer being arranged to perform said selection in dependence on the voltage at the node at each sampling instant.

The quantizer may be arranged to select one of two different voltage levels for the digital output signal in dependence on the voltage at the node. The quantizer may be connected to the node and may be arranged to sample the voltage at the node at the predetermined sampling intervals and to output the digital output signal so as to be representative of the sampled voltage at each sampling instant.

The sigma-delta modulator may comprise a control unit arranged to receive the digital output signal, the control unit being arranged to cause each switch unit to connect its respective capacitive element to either the first voltage level or the second voltage level in dependence on the digital output signal.

The control unit may be arranged to, following a sampling instant at which the quantizer selects a voltage level for the digital output signal, cause each switch unit to connect its respective capacitive element to either the first voltage level or the second voltage level for at least the duration of the sampling interval immediately following said sampling instant.

The control unit may be arranged to cause each switch unit to connect its respective capacitive element to either the first voltage level or the second voltage level in dependence on the voltage level of the digital output signal during the sampling interval immediately following said sampling instant.

The sigma-delta modulator may be arranged such that the amount of charge transferred to the plurality of capacitive elements by connecting each capacitive element to either the first voltage level or the second voltage level during a first sampling interval differs from an amount of charge transferred to the plurality of capacitive elements by connecting each capacitive element to either the first voltage level or the second voltage level during a second sampling interval immediately succeeding the first sampling interval by an amount proportional to the voltage level of the digital output signal during the second sampling interval.

The sigma-delta modulator may be arranged such that the amount of charge transferred to the plurality of capacitive elements by connecting each capacitive element to either the first voltage level or the second voltage level during a sampling interval is proportional to an integral of the digital output signal.

The control unit may comprise a digital integrator, the digital integrator being arranged to receive the digital output signal and to integrate the digital output signal to form an integrated feedback value.

The digital integrator may be arranged to integrate the digital output signal by, at each sampling instant, increasing the integrated feedback value formed at the previous sampling instant by one if the digital output signal has a first voltage level at that sampling instant and decreasing the integrated feedback value formed at the previous sampling instant by one if the digital output signal has a second voltage level at that sampling instant.

The control unit may be arranged to, during a sampling interval, cause each of the plurality of switch units to connect its respective capacitive element to either the first voltage level or the second voltage level for the duration of the sampling interval so as to transfer an amount of charge to the capacitive element that is proportional to the integrated feedback value during that sampling interval.

The control unit may be arranged to, if the integrated feedback value at a given sampling instant is greater than the integrated feedback value at the previous sampling instant, cause at least one more of the switch units to connect its respective capacitive element to the second voltage level during the sampling interval following the given time instant than during the previous sampling interval.

The control unit may be arranged to, if the integrated feedback value at a given sampling instant is less than the integrated feedback value at the previous sampling instant, cause at least one fewer of the switch units to connect its respective capacitive element to the second voltage level during the sampling interval following the given time instant than during the previous sampling interval.

The digital integrator may be arranged to form the integrated feedback value such that it comprises a plurality of bits.

The control unit may be arranged to cause, during a given sampling interval, a number of switch units proportional to the integrated feedback value during that sampling interval to connect their respective capacitors to the second voltage level.

The sigma-delta modulator may comprise a conversion unit arranged to receive the integrated feedback value and form a feedback current in dependence thereon, the conversion unit being arranged to form the feedback current to have a current value that, for the duration of a sampling interval, is proportional to the integrated feedback value during that sampling interval.

The sigma-delta modulator may be arranged such that said one end of each of the plurality of capacitive elements is arranged to receive the feedback current.

The sigma-delta modulator may be arranged such that the voltage level at the node during a sampling interval is changed dependent on the flow of feedback current through the capacitive elements during that sampling interval.

The first voltage level may be zero volts, the second voltage level may be non-zero. The second voltage level may be higher than the first voltage level.

The plurality of capacitive elements may have the same capacitance.

The control unit may be arranged to, at each sampling instant, cause each switch unit to connect its respective capacitive element to either the first voltage level or the second voltage level in dependence on the digital output signal.

The sigma-delta modulator may be arranged such that substantially all of the feedback is independent of time.

According to a second aspect of the disclosure, there is provided a method for forming a digital output signal representative of a voltage level of an input signal by means of a sigma-delta modulator having a node arranged to receive a current flow that is representative of the voltage level of the analog input signal and on whose voltage the digital output signal is dependent, the method comprising receiving the current flow at the node, the sigma-delta modulator comprising a plurality of capacitors for smoothing the current flow, each capacitor being connected at one end to the node and at its other end to a respective switching unit and providing feedback that affects the voltage at the node by connecting each capacitive element to either the first voltage level or the second voltage level by means of its respective switch unit in dependence on a voltage at the node.

Figure 6:
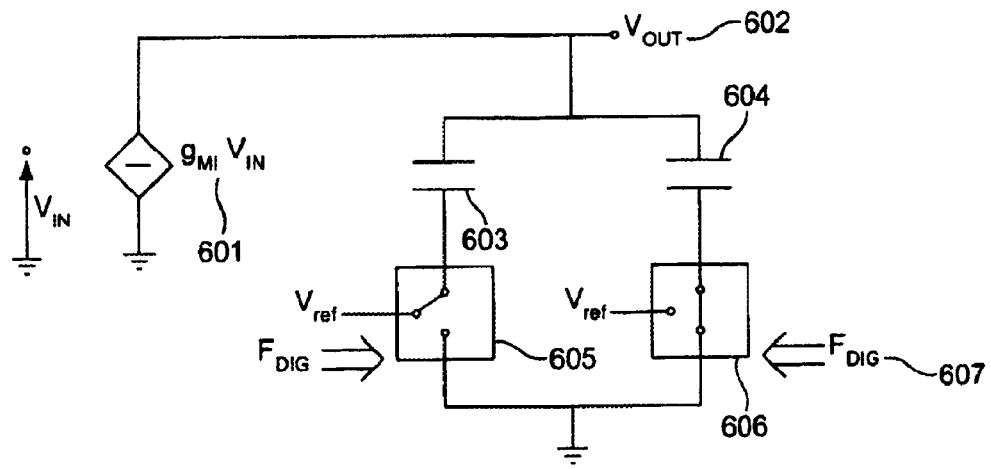
FIG. 6 shows a sigma-delta modulator in which feedback is applied through the integrator capacitor.

A sigma-delta modulator that addresses problems associated with clock jitter is shown in FIG. 6. The modulator includes a voltage-to-current converter 601 that generates an input current signal in dependence on an input voltage. The input current is supplied to a node 602 via two capacitive elements 603, 604, which have a smoothing effect on the input current. The capacitive elements are each connected between the output node and a respective switch unit 605, 606. Each switch unit includes a switch for connecting the base plate of its respective capacitive element to one of two reference voltages. In FIG. 6, the first reference voltage is shown as ground and the second reference voltage is shown as $V_{Ref}$. The switch unit is arranged to switch the base plate of the capacitive element between the two reference voltages in dependence on the voltage at the node. In the figure, this dependence has been illustrated by $F_{Dig}$ (607).

Although not shown in the figure, the voltage at the node may be received by a quantizer to form a digital output signal. This digital output signal can then be used as a feedback signal. Alternatively, the node may be followed by further integration stages, which receive the voltage at the node and integrate it. The quantizer may then be connected to the output of those integration stages and may sample the integrated voltage to form the digital output signal. A control unit may be provided to control the switch unit and cause it to connect the capacitive element to either the first reference voltage or the second reference voltage in dependence on the digital feedback signal.

In operation, the base plate of each capacitive element is initially connected to ground by the switch unit. Therefore, the input current flows through the capacitive element to ground and this current flow results in a voltage at the output node. During operation of the device, each switch unit may connect the base plate of its respective capacitive element to $V_{Ref}$. The practical effect of connecting one of the capacitive elements to $V_{Ref}$ is to instantaneously inject a known charge into that capacitive element. The charge injected is substantially independent of time. This known charge causes a change in the voltage at the output node (and so provides feedback). This results in a voltage at the output node that is determined not only by the integrated input current but also by an instantaneous feedback charge.

The time-independent nature of the charge injection can be explained by considering FIG. 6. When one of the switch units connects its respective capacitor to $V_{Ref}$, this causes a charge to be instantaneously transferred to the base plate of that capacitor. This causes an immediate alteration in the electrostatic force experienced by the input current flowing via the output node through the capacitors. This change in electrostatic force means that the voltage at the output node changes instantaneously by an amount proportional to $V_{Ref}$. The electric charge on each plate of the two capacitors changes with time as charge flows from one plate to the other and as the input current flows through the capacitors via the output node. However, if the two capacitors have the same capacitance, the movement of charge associated with one capacitor has an equal and opposite effect on the electrostatic force experienced by the input current at the output node to the other capacitor. Therefore, the instantaneous change in voltage at the output node is retained while the capacitor remains connected to $V_{Ref}$ and the other capacitor remains connected to ground.

The change in voltage at the output node caused by connecting a capacitor in an array of equal capacitors to $V_{Ref}$ is equal to $V_{Ref}$ divided by the number of capacitors in the array.

A sigma-delta modulator as shown in FIG. 6 may be advantageous because the instantaneous charge introduced by means of the integrator capacitor is independent of time. Therefore, the feedback part of the modulator is insensitive to clock jitter. The amount of charge injected by the feedback loop is also linear and unaffected by quantizer metastability. The modulator shown in FIG. 6 therefore offers improved performance over pre-existing sigma-delta modulators.

A further advantage of the sigma-delta modulator as shown in FIG. 6 may be that the charge is injected instantaneously. This is an improvement over switched-capacitor implementations in which one clock cycle is required to integrate the current feedback. The instantaneous charge injection improves the stability of the feedback loop and also offers the opportunity to introduce intentional delay into the feedback loop. Such intentional delay could be used, for example, for additional regeneration of the quantizer or for dynamic element matching (DEM) of the DAC elements.

In order to move the modulator feedback from the input of the integrator to the output of the integrator, an integrator may be included in the feedback path. This keeps the noise transfer function of the modulator unchanged. The feedback integrator is suitably a digital counter arranged to receive the digital output signal (i.e. the quantised version of the voltage at the output node). A sigma-delta modulator including a digital integrator in the feedback path is shown in FIG. 7 (at 704).

The digital integrator may be arranged to sum the digital values represented by the digital output signal at any given sampling instant. So, for example, if the digital output signal is a binary signal, the digital integrator will increase its 'count' by one if the digital output signal has a voltage level representing a 'one' and decrease its count by one if the digital output signal has a voltage level representing a 'zero'.

The digital integrator may control the switching of the plurality of switch units. For example, in FIG. 7 each of the switch units is shown receiving a respective control line 707. By triggering an appropriate control line the digital integrator can cause the associated switch unit to connect its respective capacitor to either $V_{Ref}$ or ground.

Figure 7:
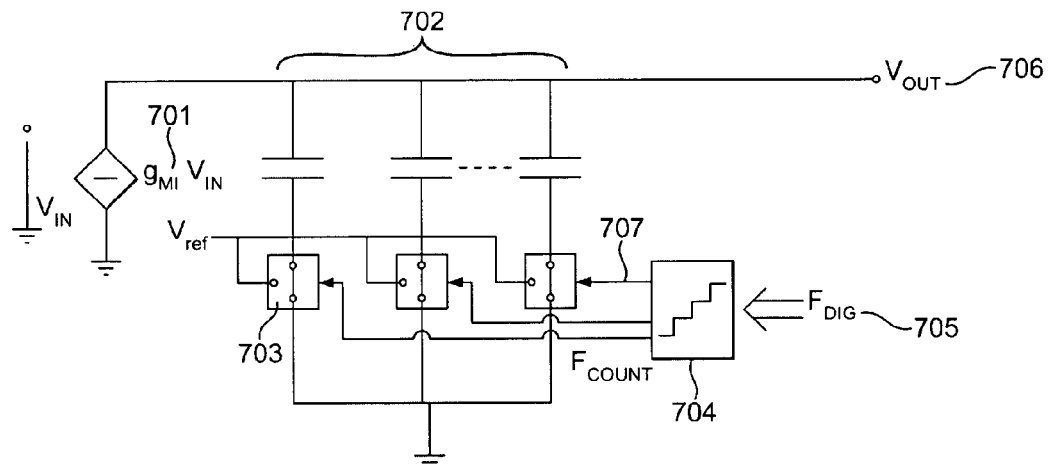
FIG. 7 shows a sigma-delta modulator including an N-capacitor array.

The digital integrator is suitably a multi-bit integrator (as shown in FIG. 7). The multi-bit digital integrator acts as a tracking quantizer for the low frequency signal of interest. The modulator therefore exhibits the performance of a modulator having an N-bit quantizer (e.g. reduction in jitter sensitivity, improved signal-to-noise ratio), but with only a single-bit quantizer.

FIG. 7 shows a modulator in which the capacitive element is a capacitor array 702, i.e. a plurality of capacitors connected in parallel. In FIG. 7, the capacitor array consists of N capacitors. The array therefore appears as a single capacitor having a capacitance C to the input current. Each capacitor in the array has an individual capacitance of C/N. Each of the capacitors in the array is connected to its own respective switch unit 703.

Each of the switch units is controlled by the output of the digital integrator. The number of switch units that momentarily connect their respective capacitors to $V_{Ref}$ during a sampling period is determined by the 'count' of the digital integrator ($F_{COUNT}$) during that sampling period. If the number of capacitors in the capacitor array is N, the digital integrator is suitably arranged to 'count' from $-N/2$ to $N/2$. The control unit causes an additional capacitor to be connected to $V_{Ref}$ for each step-wise increase of the 'count' and an additional capacitor to be connected to ground for each step-wise decrease of the 'count'. If the 'count' is zero, then half of the capacitors in the capacitor array are connected to $V_{Ref}$ and half are connected to ground.

At the commencement of a sampling period, a switch unit may switch the base plate of its respective capacitor from being connected to ground to being connected to $V_{Ref}$ (or vice versa) in dependence on the value of the digital output signal at the commencement of that sampling period. Alternatively, the switch unit may maintain the existing connection of the base plate to either ground or $V_{Ref}$, so that no switch occurs. If the switch unit does switch the connection of the base plate of its respective capacitor, that connection is maintained for at least the following sampling period.

The digital integrator may be clocked using the same clock as the quantizer, i.e. so that the integrator integrates the digital output signal at the same instant that the quantizer samples the voltage at the output node and outputs a digital representation of that voltage. Alternatively, the clock of the digital integrator may be slightly offset from the clock of the quantizer to make allowances for clock drift.

Figure 4:
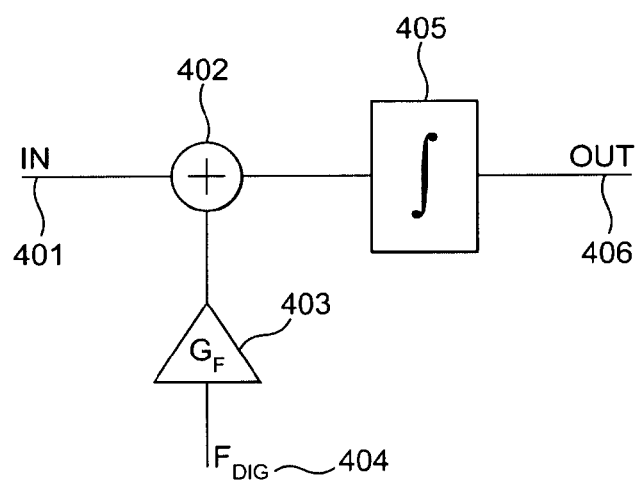
FIG. 4 shows a block diagram of a sigma-delta modulator.
Figure 5:
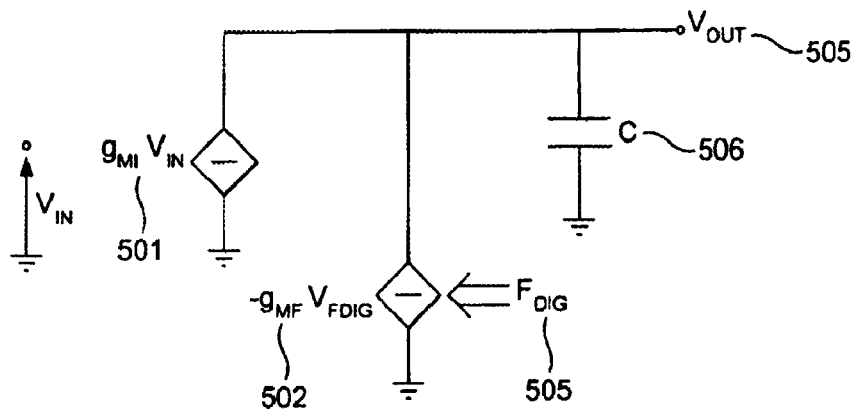
FIG. 5 shows a block diagram of classical sigma-delta modulator.

The time-independent nature of the charge injection into the integrator will now be considered with reference to FIGS. 4, 5 and 7.

The transfer function of the circuit shown in FIG. 4 in the z-domain is:

$$\text{Out}(z) = \text{In}(z)\frac{z^{-1}}{1-z^{-1}} + F_{DIG}(z)\frac{G_F z^{-1}}{1-z^{-1}} \tag{1}$$

FIG. 5 shows a classical implementation of a continuous-time sigma-delta modulator in which the input and feedback currents are both fed into a summing junction. In the Laplace domain the relationship between $V_{out}$ and $V_{in}$ is given by:

$$V_{out}(s) = \frac{V_{in}(s) \cdot g_{MI} - V_{FDig}(s) \cdot g_{MF}}{s \cdot C} \tag{2}$$

This translates to the following in the z-domain:

$$V_{out}(z) = (V_{in}(z) \cdot g_{MI} - V_{FDig}(z) \cdot g_{MF}) \cdot \frac{T_s}{C} \cdot \frac{1+z^{-1}}{1-z^{-1}} \tag{3}$$

where $T_s$ is the sampling period.

In the time domain, this translates to:

$$v_{out}(t_m) - v_{out}(t_{m-1}) = v_{in}(t_m)\frac{g_{MI}T_s}{C} - v_F(t_m)\frac{g_{MF}T_s}{C} \tag{4}$$

so that, at each sampling period $T_s$:

$$\Delta v_{out} = v_{in}\frac{g_{MI}T_s}{C} - v_{FDig}\frac{g_{MF}T_s}{C} \tag{5}$$

From the above equations, the problem with jitter in a classical implementation of a continuous-time sigma-delta modulator can be seen. Both the terms on which the change in voltage at the output node is dependent are themselves dependent on clock period. Therefore, any clock jitter is seen as noise at the output node.

The improved version of a sigma-delta modulator is shown in FIG. 7. The transfer function for this modulator can be written as:

$$V_{out}(z) = V_{in}(z)\frac{g_{MI}T_s}{C} \cdot \frac{1+z^{-1}}{1-z^{-1}} - V_{FDig} \cdot \frac{V_{Ref}}{N} \cdot \frac{1}{1-z^{-1}} \quad (6)$$

where the term $$\frac{1}{1-z^{-1}}$$

is representative of the digital integrator.

This results in a voltage change at the output node during a sampling period that is given by:

$$\Delta v_{out} = v_{in}g_{MI}\frac{T_s}{C} - v_{FDig}\frac{V_{Ref}}{N} \quad (7)$$

It can be seen from equation 7 that the effect of the feedback on the change in voltage at the output node of the modulator is independent of time. Therefore, the feedback in the improved sigma-delta modulator is jitter insensitive.

Because the modulator is a continuous-time modulator it is convenient to consider the change in voltage at the output node during a sampling interval. As demonstrated by equation 7, the change in voltage at the output node during a sampling interval is dependent on the amount of current that flows through the capacitor array during that time period. The voltage at the output node is also affected by the feedback charge injected into the capacitor array during a sampling interval. Therefore, the change in output voltage between one sampling instant and the subsequent sampling instant is dependent on the difference between the feedback charge injected into the capacitor array in the respective sampling intervals preceding those sampling instants. As demonstrated by equation 7, this difference in charge is directly proportional to the voltage of the digital feedback signal during the sampling interval immediately preceding the second sampling instant.

The digital integrator sums the voltage of the digital feedback signal during successive sampling instants. Therefore, by using the output of the digital integrator to control the momentary switching of the switch units, the number of capacitors connected to $V_{Ref}$ during any given sampling interval is determined by the sum of the digital feedback signal during the given sampling interval and during previous sampling intervals. During one sampling interval, this results in an output voltage change that is dependent on the difference between the number of capacitors connected to $V_{Ref}$ during that sampling interval and the number of capacitors connected to $V_{Ref}$ during the previous sampling interval.

Figure 8:
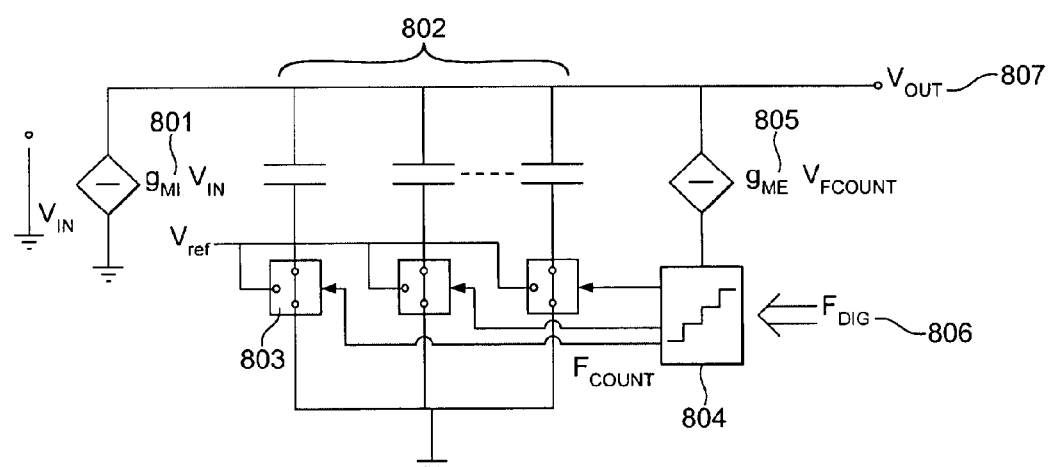
FIG. 8 shows a sigma-delta modulator including an N-capacitor array and current feedback.

Typically, the digital integrator will saturate after a number of sampling intervals, after which the modulator will no longer function correctly. An additional feedback path may be introduced to avoid this problem as shown in FIG. 8. In FIG. 8, the modulator incorporates a current source 805 that generates a feedback current. The feedback current is determined by the 'count' of the digital integrator. The effect of the feedback current is to remove the average of the feedback signal, which prevents saturation of the digital integrator.

The feedback current is given by:

$$I_{DAC} = g_{ME} \cdot V_{FCount} \quad (8)$$

where $g_{ME}$ is the current DAC gain of the current source and 'count' is the output of the digital integrator. The $g_{ME}$ factor may be selected to give a wanted transfer function for the modulator.

This overall voltage change at the output node of the modulator shown in FIG. 8 during a sampling interval can therefore be expressed by:

$$\Delta v_{out} = v_{in}g_{MI}\frac{T_s}{C} - v_{FDig}\frac{V_{Ref}}{N} - v_{FCount}g_{ME}\frac{T_s}{C} \quad (9)$$

The total amount of charge introduced by the two feedback paths in a time t is given by:

$$Q = I_{DAC} \times t \times V_{FCount} + C \times V_{Ref} \times V_{FCount} \quad (10)$$

where Q is the total charge injected, $I_{DAC}$ is the feedback current, C is the total capacitance of the capacitor array and $V_{FCount}$ is an integer between $-2^{(N-1)}$ and $2^{(N-1)}$ (which bounds the digital integrator output). From equation 10 it can be seen that the charge injection consists of two parts: a first part that results from the feedback current and which is time dependent and a second (more significant) part that results from the capacitor array and which is independent of time.

Unlike the charge injection via the capacitor array, the feedback current has an effect on the change in output voltage that is proportional to the integral of the digital output signal, and not its instantaneous value. Consequently, the current feedback signal suffers less from the problem of jitter than feedback signals in previous continuous-time sigma-delta modulators because the digital integrator acts as a first-order, low-pass filter (1/f). This significantly reduces the high frequency jitter component in the integrator output, so minimizing the jitter error introduced into the modulator by the feedback current. The reduction in the high frequency jitter component also reduces the impact of DAC non-linearity on the performance of the modulator.

The multi-bit integrator shown in FIGS. 7 and 8 also helps to address the problem of clock jitter when used to drive the DAC current source. The noise introduced by clock jitter is effectively reduced by a factor equal to the number of bits used by the multi-bit integrator. So, for example, if the integrator outputs a 16-bit result, then the effect on the DAC current source of clock jitter is reduced by a factor of $\frac{1}{16}$.

A further advantage of the improved sigma-delta modulator is that its signal transfer function is a first-order, low-pass transfer function. This makes the digital decimation filter design easier. (The digital decimation filter typically follows the sigma-delta modulator to reduce the high frequency output signal to a more manageable frequency). Also, if the modulator is made complex passband, the digital integrator can be transformed into a resonator to shape the signal transfer function as required.

In the examples above, the capacitors of the capacitive array have the same value. The capacitors of the array could have different values. In the examples above, the voltages to which all the switch units can connect their respective capacitors are the same. Different voltages, and more than two voltages, could be available to each switch unit.

Figure 9:
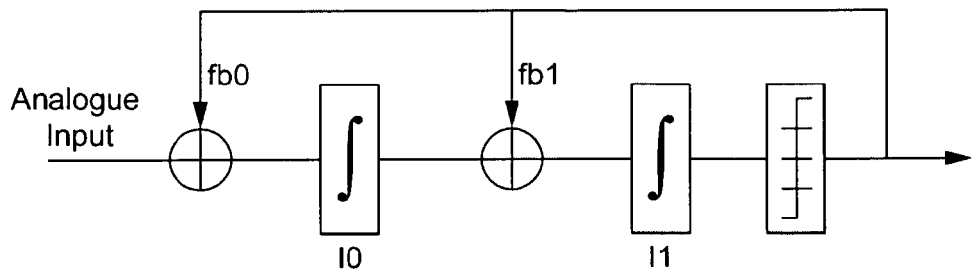
FIG. 9 shows a second order sigma-delta modulator.
Figure 10:
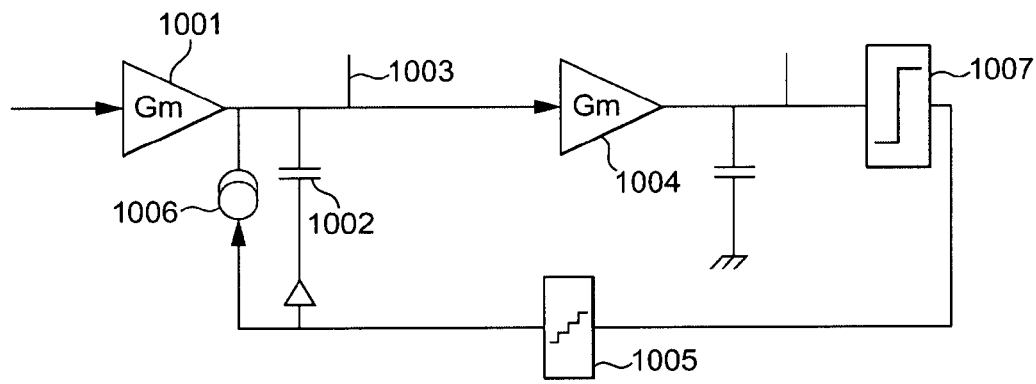
FIG. 10 shows a second-order sigma-delta modulator incorporating charge and current feedback.

Although the improved sigma-delta modulator has been described above with reference only to simple first-order sigma-delta modulators, it should be understood that this is for the purposes of example only. The described improvements may be adapted to type of sigma-delta modulator, whatever its order or complexity. As an example, FIG. 9 shows a conventional second-order sigma-delta modulator and FIG. 10 shows a second-order sigma-delta modulator incorporating instantaneous charge injection and a current feedback signal. In FIG. 10, a capacitor array comprising 16 capacitors is represented by capacitor 1002. This capacitor array receives an input current output by voltage-to-current converter 1001, which converts an input voltage into the input current. The capacitor array also receives a feedback current generated by current source 1006. Both the capacitor array and the current source operate in dependence on the output of digital integrator 1005, to which they are both connected. The output node at which the output voltage is generated is shown at 1003. However, rather than being received directly by the quantizer, the output voltage in this implementation is fed into a further integration stage 1004. Therefore, while the quantizer still forms the digital output signal in dependence on the voltage at the output node, it is not connected directly to that output node as in a simple first-order implementation.

Figure 11:
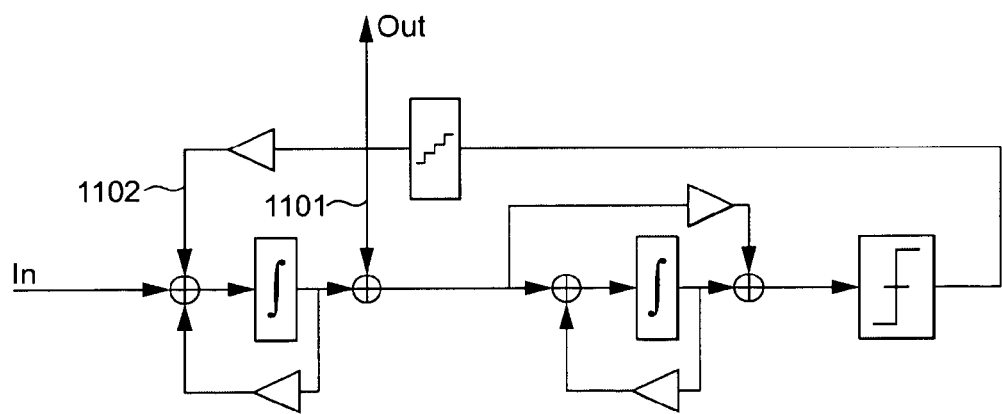
FIG. 11 shows a second-order sigma-delta modulator that is part of an in-phase/quadrature arrangement.

As a further example, FIG. 11 shows a more complex implementation of a second-order sigma-modulator that is part of an in-phase and quadrature arrangement of modulators. However, it can be seen that this more complex implementation still incorporates instantaneous charge injection (1101) and a current feedback signal (1102).

It can be seen from the examples shown in FIGS. 10 and 11 that the charge injection principle described herein can be incorporated into any suitable design of sigma-delta modulator. The principles described herein are therefore not limited to any particular design of sigma-delta modulator.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present disclosure may consist of any such feature or combination of features. In view of the foregoing description it will be evident to a person skilled in the art that various modifications may be made within the scope of the disclosure.

The invention claimed is:

1. A continuous time sigma-delta modulator for forming a digital output signal representative of a voltage level of an input signal, the continuous time sigma delta modulator having a node arranged to receive a current flow that is representative of the voltage level of the input signal and on whose voltage the digital output signal is dependent, the continuous time sigma-delta modulator comprising:
a plurality of capacitive elements for smoothing the current flow, each capacitive element being connected at one end to the node and at its other end to a respective switch unit; and
a plurality of switch units, each switch unit being arranged to connect the respective one of the capacitive elements to either a first voltage level or a second voltage level in dependence on the voltage at the node so as to provide feedback that affects the voltage at the node.

2. A sigma-delta modulator as claimed in claim 1, wherein the sigma-delta modulator is arranged such that connecting a capacitive element to the second voltage level causes an electrical charge to be transferred to that capacitive element.

3. A sigma-delta modulator as claimed in claim 2, wherein the sigma-delta modulator is arranged such that the voltage level at the output node is changed dependent on an electrical charge transferred to a capacitive element.

4. A sigma-delta modulator as claimed in claim 3, wherein the sigma-delta modulator is arranged such that the change in voltage at the output node caused by connecting one or more of the capacitive elements to the second voltage level is equal to the second voltage level divided by the number of those one or more capacitive elements connected to the second voltage level.

5. A sigma-delta modulator as claimed in claim 1, wherein the sigma-delta modulator is arranged such that the voltage level at the node during a sampling interval is changed dependent on the flow of current representative of the input voltage through the capacitive element during that sampling interval.

6. A sigma-delta modulator as claimed in claim 1, wherein the sigma-delta modulator comprises a quantizer arranged to form the digital output signal by selecting a voltage level for the digital output signal at predetermined sampling intervals, the quantizer being arranged to perform said selection in dependence on the voltage at the node at each sampling instant.

7. A sigma-delta modulator as claimed in claim 6, wherein the quantizer is arranged to select one of two different voltage levels for the digital output signal in dependence on the voltage at the node.

8. A sigma-delta modulator as claimed in claim 6, wherein the quantizer is connected to the node, the quantizer being arranged to sample the voltage at the node at the predetermined sampling intervals and to output the digital output signal so as to be representative of the sampled voltage at each sampling instant.

9. A sigma-delta modulator as claimed in claim 6, wherein the sigma-delta modulator comprises a control unit arranged to receive the digital output signal, the control unit being arranged to cause each switch unit to connect its respective capacitive element to either the first voltage level or the second voltage level in dependence on the digital output signal.

10. A sigma-delta modulator as claimed in claim 9, wherein the control unit is arranged to, following a sampling instant at which the quantizer selects a voltage level for the digital output signal, cause each switch unit to connect its respective capacitive element to either the first voltage level or the second voltage level for at least the duration of the sampling interval immediately following said sampling instant.

11. A sigma-delta modulator as claimed in claim 9, wherein the control unit comprises a digital integrator, the digital integrator being arranged to receive the digital output signal and to integrate the digital output signal to form an integrated feedback value.

12. A sigma-delta modulator as claimed in claim 11, wherein the digital integrator is arranged to integrate the digital output signal by, at each sampling instant, increasing the integrated feedback value formed at the previous sampling instant by one if the digital output signal has a first voltage level at that sampling instant and decreasing the integrated feedback value formed at the previous sampling instant by one if the digital output signal has a second voltage level at that sampling instant.

13. A sigma-delta modulator as claimed in claim 11, wherein the control unit is arranged to, during a sampling interval, cause each of the plurality of switch units to connect its respective capacitive element to either the first voltage level or the second voltage level for the duration of the sampling interval so as to transfer an amount of charge to the capacitive element that is proportional to the integrated feedback value during that sampling interval.

14. A sigma-delta modulator as claimed in claim 11, wherein the digital integrator is arranged to form the integrated feedback value such that it comprises a plurality of bits.

15. A sigma-delta modulator as claimed in claim 11, wherein the control unit is arranged to cause, during a given sampling interval, a number of switch units proportional to the integrated feedback value during that sampling interval to connect their respective capacitors to the second voltage level.

16. A sigma-delta modulator as claimed in claim 11, the sigma-delta modulator comprising a conversion unit arranged to receive the integrated feedback value and form a feedback current in dependence thereon, the conversion unit being arranged to form the feedback current to have a current value that, for the duration of a sampling interval, is proportional to the integrated feedback value during that sampling interval.

17. A sigma-delta modulator as claimed in claim 16, wherein the sigma-delta modulator is arranged such that said one end of each of the plurality of capacitive elements is arranged to receive the feedback current.

18. A sigma-delta modulator as claimed in claim 17, wherein the sigma-delta modulator is arranged such that the voltage level at the node during a sampling interval is changed dependent on the flow of feedback current through the capacitive elements during that sampling interval.

19. A sigma-delta modulator as claimed in claim 9, wherein the control unit is arranged to, at each sampling instant, cause each switch unit to connect its respective capacitive element to either the first voltage level or the second voltage level in dependence on the digital output signal.

20. A sigma-delta modulator as claimed in claim 1, wherein the sigma-delta modulator is arranged such that the amount of charge transferred to the plurality of capacitive elements by connecting each capacitive element to either the first voltage level or the second voltage level during a first sampling interval differs from an amount of charge transferred to the plurality of capacitive elements by connecting each capacitive element to either the first voltage level or the second voltage level during a second sampling interval immediately succeeding the first sampling interval by an amount proportional to the voltage level of the digital output signal during the second sampling interval.

21. A sigma-delta modulator as claimed in claim 1, wherein the sigma-delta modulator is arranged such that the amount of charge transferred to the plurality of capacitive elements by connecting each capacitive element to either the first voltage level or the second voltage level during a sampling interval is proportional to an integral of the digital output signal.

22. A sigma-delta modulator as claimed in claim 21, wherein the control unit is arranged to, if the integrated feedback value at a given sampling instant is greater than the integrated feedback value at the previous sampling instant, cause at least one more of the switch units to connect its respective capacitive element to the second voltage level during the sampling interval following the given time instant than during the previous sampling interval.

23. A sigma-delta modulator as claimed in claim 21, wherein the control unit is arranged to, if the integrated feedback value at a given sampling instant is less than the integrated feedback value at the previous sampling instant, cause at least one fewer of the switch units to connect its respective capacitive element to the second voltage level during the sampling interval following the given time instant than during the previous sampling interval.

24. A sigma-delta modulator as claimed in claim 1, wherein the sigma-delta modulator is arranged such that substantially all of the feedback is independent of time.

25. A method for forming a digital output signal representative of a voltage level of an analog input signal by means of a continuous time sigma-delta modulator having a node arranged to receive a current flow that is representative of the voltage level of the analog input signal and on whose voltage the digital output signal is dependent, the method comprising:
receiving the current flow at the node, the continuous time sigma-delta modulator comprising a plurality of capacitors for smoothing the current flow, each capacitor being connected at one end to the node and at its other end to a respective switching unit; and
providing feedback that affects the voltage at the node by connecting each capacitive element to either the first voltage level or the second voltage level by means of its respective switch unit in dependence on a voltage at the node.

* * * * *